(12) United States Patent
Zhou

(10) Patent No.: US 7,826,338 B2
(45) Date of Patent: Nov. 2, 2010

(54) METHOD AND APPARATUS FOR ADAPTIVE POWER ADJUSTMENT BASED ON REDUCTION OF CROSS-TALK BETWEEN DSLS

(75) Inventor: Jun Zhou, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 197 days.

(21) Appl. No.: 12/051,691

(22) Filed: Mar. 19, 2008

(65) Prior Publication Data

US 2008/0212768 A1   Sep. 4, 2008

Related U.S. Application Data

(63) Continuation of application No. PCT/CN2006/002407, filed on Sep. 15, 2006.

(30) Foreign Application Priority Data

Sep. 21, 2005   (CN) .................... 2005 1 0104836

(51) Int. Cl.
*H04J 1/12* (2006.01)
(52) U.S. Cl. ..................... 370/201; 379/417
(58) Field of Classification Search ........... 370/201, 370/252; 379/417; 375/260–261, 254, 284–285; 439/676; 455/522
See application file for complete search history.

(56) References Cited

U.S. PATENT DOCUMENTS 6,055,297 A * 4/2000 Terry .................... 379/1.01

| 6,205,220 | B1  |   | 3/2001  | Jacobsen et al. |
|-----------|-----|---|---------|-----------------|
| 6,317,495 | B1  | * | 11/2001 | Gaikwad et al. ............ 379/417 |
| 7,529,176 | B2  | * | 5/2009  | Verlinden et al. ........... 370/201 |
| 7,664,254 | B2  |   | 2/2010  | Bostoen et al. |
| 7,664,522 | B2  | * | 2/2010  | Stolle et al. .................. 455/522 |
| 2003/0086514 | A1 |  | 5/2003  | Ginis et al. |
| 2003/0099350 | A1 |  | 5/2003  | Bostoen et al. |
| 2003/0227938 | A1 |  | 12/2003 | Slabbinck et al. |
| 2004/0114751 | A1 |  | 6/2004  | Tomilson |
| 2007/0004286 | A1 | * | 1/2007  | Hobbel ...................... 439/676 |
| 2007/0081582 | A1 |  | 4/2007  | Ginis et al. |
| 2009/0161574 | A1 | * | 6/2009  | Black ........................ 370/252 |

FOREIGN PATENT DOCUMENTS

| CN | 1250276 A | 4/2000 |
|----|-----------|--------|
| CN | 1427551 A | 7/2003 |

(Continued)

*Primary Examiner*—Aung S Moe
*Assistant Examiner*—Vinncelas Louis
(74) *Attorney, Agent, or Firm*—Leydig, Voit & Mayer, Ltd.

(57) ABSTRACT

An adaptive power adjustment method and means based on reducing crosstalk among DSL lines includes: calculating the crosstalk power spectrum density and the crosstalk function from the neighboring line in current line; calculating the transmission power spectrum density of the current terminal device according to the obtained crosstalk power spectrum density and crosstalk function; and the current terminal device controlling the transmission power based on the transmission power spectrum density. According to the adaptive power adjustment method of the present invention, the transmission power can be increased or decreased. The disadvantageous effect due to the crosstalk among xDSL lines is reduced. Present invention can eliminate or reduce adequately the strong impact on remote terminal application scene, and make the lines achieve the optimum operation state.

17 Claims, 4 Drawing Sheets

FOREIGN PATENT DOCUMENTS

| | | |
|---|---|---|
| CN | 1655470 A | 8/2005 |
| EP | 1 300 964 A1 | 4/2003 |
| EP | 1 370 057 A1 | 12/2003 |
| EP | 1 429 508 A2 | 6/2004 |
| WO | WO 02/100008 A1 | 12/2002 |

* cited by examiner

METHOD AND APPARATUS FOR ADAPTIVE POWER ADJUSTMENT BASED ON REDUCTION OF CROSS-TALK BETWEEN DSLS

CROSS REFERENCE OF RELATED APPLICATIONS

The application is a Continuation application of PCT/CN2006/002407 submitted on Sep. 15, 2006, claiming the priority from a Chinese patent application No. 200510104836.7 submitted on Sep. 21, 2005, the contents of which are incorporated herein entirely by reference.

FIELD OF THE INVENTION

The invention relates to the field of network communications, and in particular, to a method and apparatus for adaptive power adjustment based on reduction of cross-talk between Digital Subscriber Lines (DSLs).

BACKGROUND OF THE INVENTION

In the existing communication systems, Digital Subscriber Line (xDSL) is a technique for high speed data transmission over telephone twisted pairs (e.g. Unshielded Twist Pair, UTP). In addition to the base-band transmission DSLs, such as Integrated service digital network (ISDN) DSL (IDSL) and High speed DSL (HDSL), the pass-band transmission xDSL utilizes the frequency division multiplexing (FDM) technique so that the xDSL service may coexist with the POTS (Plain Old Telephone Service) in a same twist pair. The xDSL service occupies the higher frequency band, while the POTS occupies the base band below 4 KHz. As shown in FIG. 1, the POTS signal and the xDSL signal may be separated from each other by a splitter. A system that provides multiple xDSL access is called a DSL Access Multiplexer (DSLAM).

Because xDSL signals are transmitted over UTP which is originally designed for voice transmission, there may be a lot of factors damaging the high frequency signals, such as external interference, noise, interference between conductors including in the same cable, and line parameter alterations due to environmental variations. These factors may cause instable operation of an xDSL system.

After years of development, the xDSL technique has evolved, from the first generation, i.e. Asymmetric Digital Subscriber Line (ADSL), into the current second generation, i.e. ADSL2, ADSL2+ and Very High Speed Digital Subscriber Line 2 (VDSL2), with the bandwidth and the number of frequency bands increasing gradually. ADSL and ADSL2 utilize a downlink bandwidth below 1.1 MHz, providing downlink rates of up to 8 Mbps. In ADSL2+, the downlink bandwidth is expanded to 2.2 MHz, providing a downlink rates of up to 24 Mbps. VDSL2 utilizes a bandwidth of up to 30 MHz, providing rates of up to 100 Mbps simultaneously in both the uplink and downlink directions. With the bandwidth expanding in xDSL technique, the crosstalk in high frequency bands is becoming increasingly significant.

As shown in FIG. 2 and FIG. 3, near end crosstalk does not cause much damage to the performance of an xDSL system, because frequency division multiplexing is utilized for uplink and downlink channels in xDSL. However, far end crosstalk has a significant impact on the performance of transmission lines. In other words, when multiple users request to put services into operation over a bundle of cables, some lines may be of low rate, instable performance or even can not be put into operation because of the far end crosstalk, resulting in a lower DSLAM line activation rate. In the application scenario as shown in FIG. 3, a much severer crosstalk may be resulted.

In view of the above, many operators have defined their own spectrum application management specifications for specifying spectrum planning under various application scenarios, to prevent performance deterioration due to mutual interferences between devices of various locations.

Currently, carriers of some frequency bands may be switched off to prevent crosstalk. As shown in FIG. 4, carriers, that are overlapped with ADSL downlink frequency bands, in far end ADSL2+ are switched off, to reduce downlink interference from the carriers to ADSL of Central Office (CO). By switching off the carriers, the crosstalk from downlink signals of a remote module to the central office module may be prevented, because the bandwidths are no longer overlapped.

In the above method of switching off carriers in frequency bands, the requirements of spectrum management of spectrum compatibility may be met. However, as shown in FIG. 4, only carriers in frequency band above 1.1 MHz are utilized in the far end DSLAM (i.e. the remote module), and attenuation in the frequency band above 1.1 MHz is greater than that in a frequency band below 1.1 MHz. Therefore, the transmission performance may be deteriorated rapidly with the lengthening of transmission distance, thereby bringing about a significant limitation to the performance of the remote module.

In addition, because a fixed spectrum setting is employed in the above method of switching off carriers, a dynamic adaptive variation according to the spectrum variations in lines is impossible, resulting in low spectrum utilization.

Furthermore, in the above method of switching off carriers, the corresponding spectrum is required to be configured manually. In other words, an automatic configuration is impossible in the above method. This brings about a large workload of manual configuration in the case of complicated lines.

SUMMARY OF THE INVENTION

An object of the invention is to provide a method and apparatus for adaptive power adjustment based on reduction of cross-talk between Digital Subscriber Lines (DSLs), to manage spectrum dynamically while effectively reducing the crosstalk in the communication system.

The object of the invention is achieved by the following technical solution.

A method for adaptive power adjustment based on reduction of cross-talk between Digital Subscriber Lines (DSLs) is provided. The method may include:

calculating a power spectrum density of crosstalk to a line from adjacent lines, and determining a crosstalk function;

calculating and determining a transmitting power spectrum density of a local device according to the calculated power spectrum density of the crosstalk and the crosstalk function; and controlling, by the local device, a transmitting power according to the transmitting power spectrum density.

Before calculating the power spectrum density of the crosstalk to the line from the adjacent lines and determining the crosstalk function, the method may further include:

determining an electrical length value of the line of the local device, and calculating the power spectrum density of the crosstalk to the line from the adjacent lines and determining the crosstalk function if the electrical length value is greater than a preset value.

The preset value may be set according to transmission characteristics of the line or according to actual application environment.

The calculating and determining the transmitting power spectrum density of the local device may include:

calculating a value of the power spectrum density according to a ground noise value and an additional white Gaussian noise value;

calculating an attenuation function of the line, and calculating a value of the crosstalk function according to the attenuation function; and calculating a value of the transmitting power spectrum density according to the value of the power spectrum density and the value of the crosstalk function, and controlling the transmitting power according to the value of the transmitting power spectrum density The value of the power spectrum density may be:

$$X_{tlk}(f) = \begin{cases} SNR(f) & SNR(f) > n(f) \\ -\infty & SNR(f) \le n(f) \end{cases} \text{dB},$$

n(f) is an additional white Gaussian noise.
The attenuation function of the line may be:

$$LOS(L,f) = k_0 L + k_1 L\sqrt{f} + k_2 L f \text{ dB},$$

$k_0$ $k_1$ $k_2$ are constants, each having a value within a range between 15.

The crosstalk function may be:

$$|H_{xtalk}(f)|^2 = 10 \times \log_{10}\left(10^{\frac{LOS(L,f)}{5}} \times m \times L \times f^2\right)$$

m is a crosstalk coupling constant having a value of $9.877 \times 10^{-21}$, LOS(L, f) is the attenuation function of the line.

The transmitting power spectrum density may be:

$$TxPSD_3(L, f) = \begin{cases} (X_{tlk}(f) + |H_{xtalk}(f)|^2 + PSD_0(f) & SNR(f) > n(f) \\ PSD(f) & SNR(f) \le n(f) \end{cases} \text{dB},$$

$PSD_0(f)$ is a function of frequency which is an arbitrary power spectrum density function meeting specifications of standards, $X_{tlk}(f)$ is the power spectrum density, $H_{xtalk}(f)$ is the crosstalk function.

In the invention, before calculating the power spectrum density of the crosstalk to the line from the adjacent lines and determining the crosstalk function, the method may further include:

determining an electrical length value of the line of the local device, employing a frequency allocation principle from low frequency to high frequency if the electrical length value of the line of the local device is greater than a preset value, or employing a frequency allocation principle from high frequency to low frequency if the electrical length value of the line of the local device is less than or equal to the preset value.

The method may further include:

utilizing a standard power as the transmitting power of the local device if reserved low frequency band resources are entirely occupied; and/or calculating the power spectrum density of the crosstalk to the line from the adjacent lines and determining the crosstalk function if reserved high frequency band resources are entirely occupied.

In the invention, before determining the electrical length value of the line of the local device, the method may further include:

judging whether a rate of the local device is constant, determining the electrical length value of the line of the local device if the rate is constant, or calculating the power spectrum density of the crosstalk to the line from the adjacent lines and determining the crosstalk function if the rate is not constant, and utilizing a standard power as the transmitting power of the local device when the electrical length value of the line of the local device is greater than the preset value.

The method may further include:

judging whether a ground noise of the line of the local device has changed, continuing normal operation if the ground noise of the line of the local device has not changed, or calculating the power spectrum density of the crosstalk to the line from the adjacent lines and determining the crosstalk function if the ground noise of the line of the local device has changed.

An apparatus for adaptive power adjustment is provided. The apparatus may include:

a power spectrum density calculating module, adapted to calculate a power spectrum density value of a crosstalk to a line of a local device from adjacent lines;

a crosstalk function calculating module, adapted to calculate a crosstalk function, to the line of the local device, from the adjacent lines; and a transmitting power spectrum density calculating module, adapted to calculate a transmitting power spectrum density of the local device according to the power spectrum density value of the crosstalk and a value of the crosstalk function.

The apparatus may further include:

an attenuation function calculating module, adapted to calculate an attenuation function of the line of the local device, and provide the attenuation function to a crosstalk function calculating module to be used as a basis for calculating the crosstalk function.

The apparatus may further include:

a frequency allocation processing module, adapted to determine, according to a relationship between an electrical length of a newly added line and a preset value, to employ a bit allocation principle from low frequency to high frequency when the electrical length is greater than the preset value, or employ a bit allocation principle from high frequency to low frequency when the electrical length is less than or equal to the preset value, and trigger the transmitting power spectrum density calculating module when bit allocation in frequency band is finished.

The apparatus may further include:

a rate identifying module, adapted to judge whether a rate is constant, trigger the frequency allocation processing module if the rate is constant, or directly trigger the transmitting power spectrum density calculating module if the rate is not constant.

The apparatus may be arranged in a Digital Subscriber Line Access Multiplexer (DSLAM).

As can be seen from above, a method for adaptive power adjustment based on reduction of cross-talk between DSLs is provided in the invention. The method may dynamically adapt to the variations in lines, such as the variations of spectrum, variations of signal-noise-ratio and electrical lengths in the lines.

Accordingly, with the invention, the spectrum no longer needs to be configured manually. In this way, the workload in the processing for complicated situations may be reduced, the spectrum in the lines may be utilized with advantage, and the power may be adjusted adaptively.

DETAILED DESCRIPTION OF THE EMBODIMENTS

In the invention, the spectrum may be managed automatically while mitigating the adverse affect resulted from crosstalk between xDSLs, without the control or information of the system. In particular, the severe affect for normally operating lines resulted from crosstalk in the far end application scenarios may be eliminated or reduced sufficiently.

In the invention, the power is adjusted by dynamically adjusting the signal-noise-ratio of lines. According to applicable scenarios, determined according to the electrical length of a line newly added in a network, and real-time detected variations of ground noise in the line, the transmitting power is adjusted automatically by repeatedly applying a scenario policy, to mitigate or avoid the adverse affect resulted from the crosstalk between lines.

To make the invention better understood, a method according to the invention is described below in conjunction with the accompanying drawings.

Figure 1:
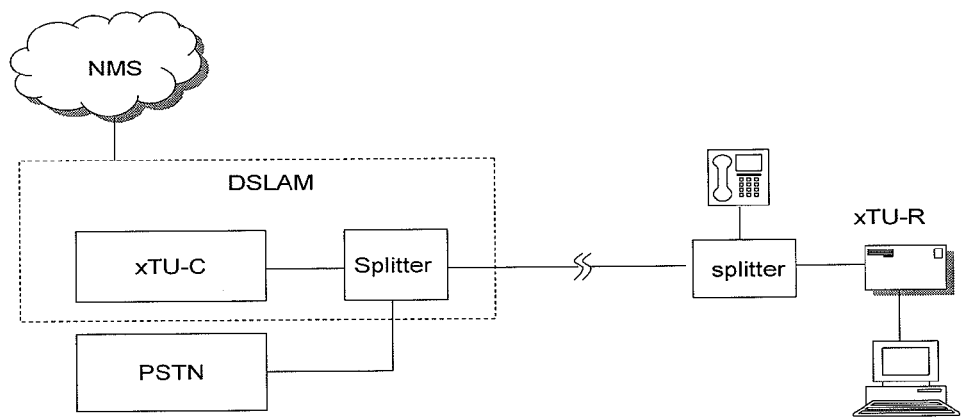
FIG. 1 is a schematic diagram illustrating a reference model of an xDSL system.
Figure 2:
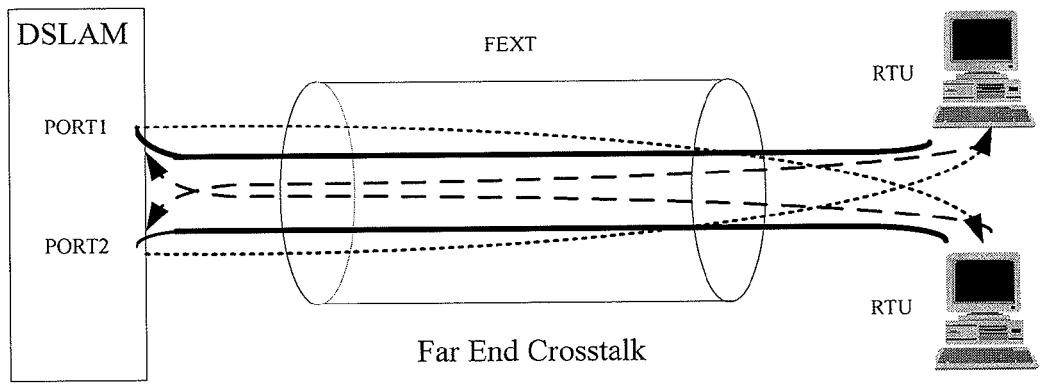
FIG. 2 is a schematic diagram illustrating far end crosstalk.
Figure 3:
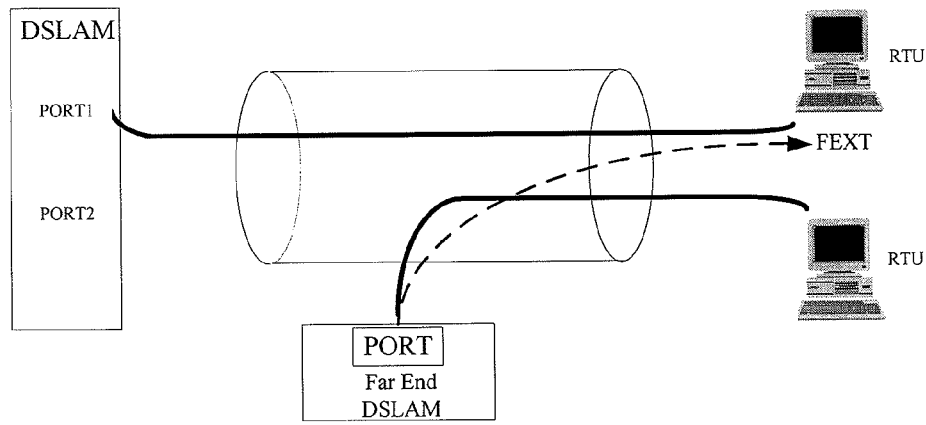
FIG. 3 is a schematic diagram illustrating far end crosstalk.
Figure 4:
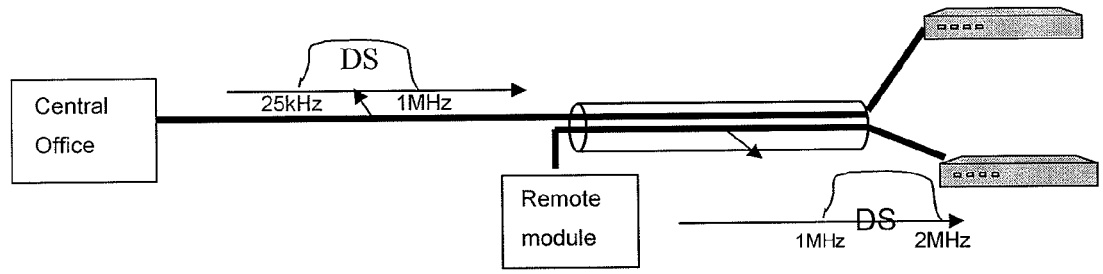
FIG. 4 is a schematic diagram illustrating a method in EP 1370057.
Figure 5:
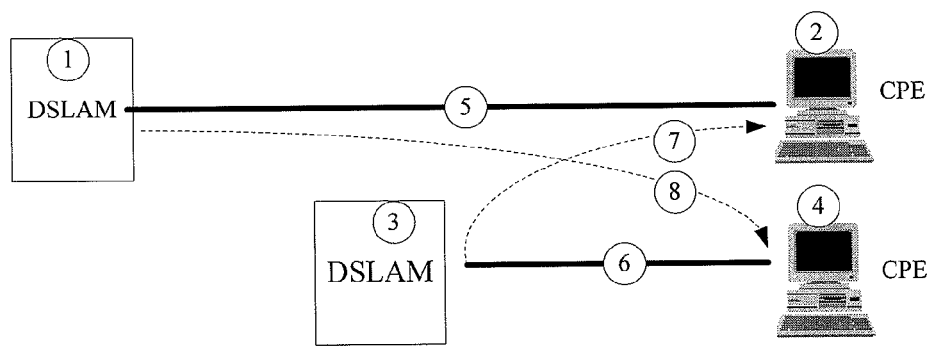
FIG. 5 is a schematic diagram illustrating line transmission of a DSL system.

The method according to the invention is particularly applicable to the application scenario as shown in FIG. 5. In FIG. 5, a first line ⑤ and a second line ⑥, if near a user side, are arranged within one cable. In this way, transmission over the line between a first DSL Access Multiplexer (DSLAM) ① and first Customer-premises equipment (CPE) ② may cause a first far end crosstalk ⑧ to the line between a second DSLAM ③ and a second CPE ④. Similarly, transmission over the line between the second DSLAM ③ and the second CPE ④ may cause a second far end crosstalk ⑦ between the first DSLAM ① and the first CPE ②. In actual application, the latter may have a more severe affect. In the invention, the severe affect on the first line ⑤ resulted from the second far end crosstalk ⑦ in the application scenario as shown in FIG. 5 may be eliminated or mitigated sufficiently.

Figure 6:
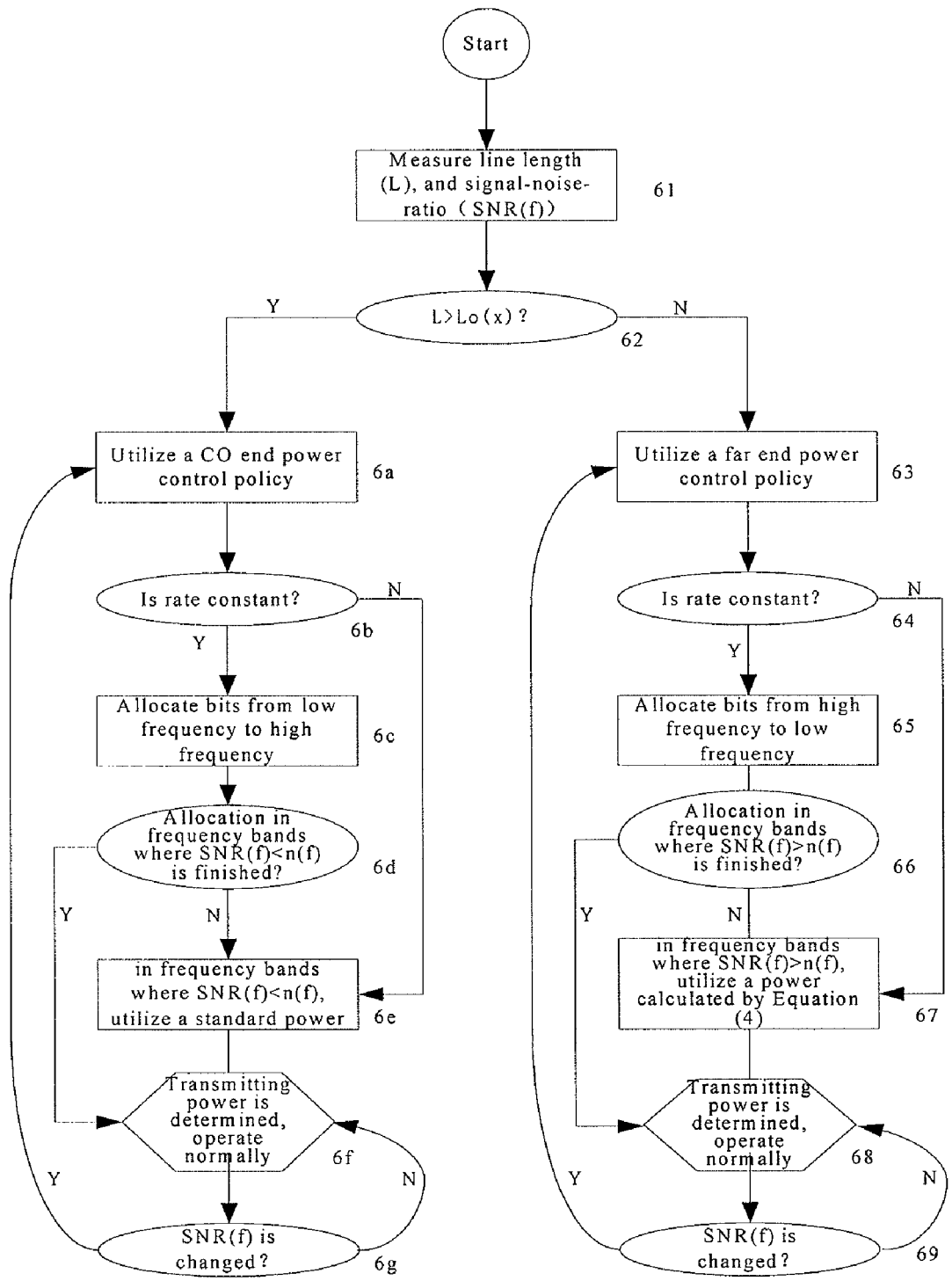
FIG. 6 shows a flow chart illustrating a method for adaptive power adjustment based on reduction of crosstalk between DSLs.

FIG. 6 illustrates an implementation example of the method according to the invention. Based on the application scenario as shown in FIG. 5, the method may be as follows.

In step 61, an electrical length L and ground noise SNR(f) of a newly added line are obtained.

A Channel Discovery solution in standard G.993.2 may be used to obtain the above two parameters. The method for obtaining the above two parameters is not limited to this In step 62, a most likely application scenario is determined according to the electrical length L and the practical situations.

A default length value $L_0(x)$ may be selected according to characteristics of various DSLs, or an operator may set a length value L(x) according to local actual application scenarios. "x" represents different length values corresponding to different DSLs.

The most likely application scenario is determined by comparing the electrical length L with the value of $L_0(x)$ or $L(x)$, to select a corresponding power control policy. In particular, (1) when $L>L_0(x)$ or when $L>L(x)$, a Central Office (CO) end scenario is determined as the most likely application scenario, and a CO end power control policy is applied to the newly added line, the process proceeds to step 6a.

(2) when $L \leq L_0(x)$ or when $L \leq L(x)$, a far end scenario is determined as the most likely application scenario, and a far end power control policy is applied to the newly added line, the process proceeds to step 63.

The condition of the first line ⑤ as shown in FIG. 5 is called CO end scenario, and the CO end power control policy is applied to the first line ⑤. The condition of the second line ⑥ as shown in FIG. 5 is called far end scenario, and the far end power control policy is applied to the second line ⑥.

In step 63, supposing the first line ⑤ between the first DSLAM ① and the first CPE ② is in normal operation and the second line ⑥ between the second DSLAM ③ and the second CPE ④ is the newly added line, the second line ⑥ is then determined as a line to be detected, the far end scenario is determined as the most likely application scenario, and the far end power control policy is applied, and the process proceeds to step 64.

In step 64, the rate setting of the second line ⑥ is detected, and it is judged whether the rate is constant. If the rate is constant, the process proceeds to step 65. If the rate is not constant, the process proceeds to step 67.

Figure 7:
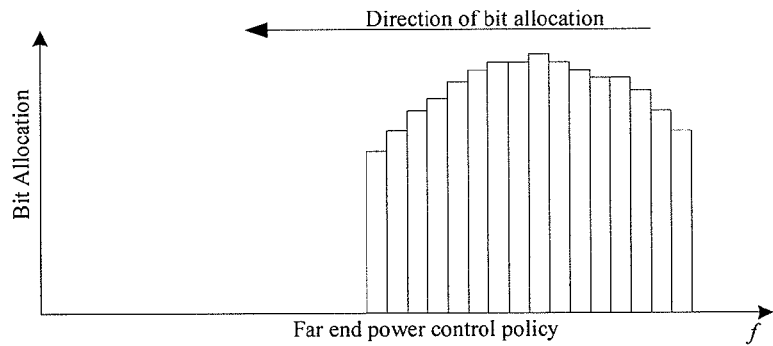
FIG. 7 is a schematic diagram illustrating a bit allocation principle of a far end power control policy when the data rate is fixed.

In step 65, bit allocation of the far end power control policy follows an allocation principle from high frequency to low frequency. FIG. 7 illustrates a particular bit allocation manner.

In step 66, it is judged whether bits in frequency bands where SNR(f)<n(f) have been allocated. n(f) represents an additional white Gaussian noise. In other words, it is judged whether reserved high frequency band resources are entirely occupied or not. If the reserved high frequency band resources are entirely occupied, the process proceeds to step 68. If the reserved high frequency band resources are not entirely occupied, the process proceeds to step 67.

In step 67, When SNR(f)>n(f), the line of local end devices carries a transmission signal having same frequencies as that in an adjacent line, so that downlink spectrum of the newly added line is overlapped with that of the line in normal operation, thereby causing crosstalk. So, a desired line transmitting power is required to be calculated. Line transmitting power of the newly added line is adjusted automatically according to the desired line transmitting power.

A process for calculating the desired line transmitting power is described as follows.

In a first step, power spectrum density $X_{tlk}(f)$ of the first far end crosstalk ⑧ is calculated by the following Equation (1). In the gross, the SNR(f) may be regarded as including the first far end crosstalk ⑧ and the additional white Gaussian noise (AWGN).

$$X_{tlk}(f) = \begin{cases} SNR(f) & SNR(f) > n(f) \\ -\infty & SNR(f) \leq n(f) \end{cases} \text{dB}; \quad \text{Equation (1)}$$

In Equation (1), n(f) represents the additional white Gaussian noise. n(f) may be a function related to frequencies configured according to each particular application environment. Generally, n(f) may be assigned with a value of −140 dBm/Hz.

In a second step, an attenuation function LOS(L, f) of the second line ⑥ is estimated by the following Equation (2):

$$LOS(L,f) = k_0 L + k_1 L + k_1 L\sqrt{f} + k_2 L f \text{ dB} \quad \text{Equation (2)}$$

In Equation (2), $k_0$, $k_1$ and $k_2$ are constant numbers. The values of $k_0$, $k_1$ and $k_2$ may be within a range between ±15 according to different conditions (such as line gauge, aging degree) of the line.

In a third step, a crosstalk function $|H_{xtalk}(f)|^2$ from the first line ⑤ to the second line ⑥ is estimated by the following Equation (3):

$$|H_{xtalk}(f)|^2 = 10 \times \log_{10}\left(10^{\frac{LOS(L,f)}{5}} \times m \times L \times f^2\right); \quad \text{Equation (3)}$$

In Equation (3), "m" represents a crosstalk coupling constant with a value of $9.877 \times 10^{-21}$.

In a fourth step, a transmitting power spectrum density $TxPSD_3(L, f)$ of a corresponding port of the second DSLAM ☐ is calculated by the following Equation (4), and the process proceeds to step 68.

$$TxPSD_3(L, f) = \begin{cases} (X_{tlk}(f) + |H_{xtalk}(f)|^2) + PSD_0(f) & SNR(f) > n(f) \\ PSD(f) & SNR(f) \leq n(f) \end{cases} \text{dB}; \quad \text{Equation (4)}$$

In Equation (4), $PSD_0(f)$ is a function of frequency. $PSD(f)$ is an arbitrary power spectrum density function meeting the specifications of standard, and is the original power spectrum density when the power spectrum density of a line alters dynamically.

As can be seen from Equation (4), the transmitting spectrum of the second DSLAM ③ is divided into two parts as follows.

(1) In a spectrum segment meeting the requirement of $SNR(f) \geq n(f)$, the downlink spectrum of the first line ⑤ is overlapped with that of the second line ⑥. Therefore, the transmitting power spectrum of the second DSLAM ③ in the spectrum segment may be decreased properly, to reduce the interference from the second line ⑥ to the first line ⑤.

(2) In a spectrum segment meeting the requirement of $SNR(f) < n(f)$, the transmitting power in this spectrum segment in the newly added line may be selected arbitrarily within a range specified by standards, because the line in normal operation does not transmit over this spectrum segment. In the example, the transmitting power in this spectrum segment in the second line ⑥ may be selected arbitrarily within a range specified by standards, without any interference from the second line ⑥ to the first line ⑤, because the first line ⑤ does not transmit over this spectrum segment.

According to the transmitting power spectrum density $TxPSD_3(L, f)$ of the corresponding port of the second DSLAM ③, i.e. the desired line transmitting power, calculated by Equation (4), the system automatically adjusts the transmitting power of the corresponding port of the second DSLAM ③.

In step 68, the system determines the desired line transmitting power, reduces or eliminates crosstalk between lines by using the desired line transmitting power, to enable the normal operation of lines.

In step 69, the system continues to automatically detect whether the ground noise SNR(f) of the newly added line has been changed. If the ground noise SNR(f) of the newly added line has been changed, the process proceeds to step 63. If the ground noise SNR(f) of the newly added line has not been changed, the process proceeds to step 68. In this way, the system may adapt to the variations of the lines dynamically, i.e., the system have an adaptive characteristic.

Also with reference to FIG. 6, a process for adaptive power adjustment by using the CO end power control policy is described below.

In step 6a, if the second line ⑥ between the second DSLAM ③ and the second CPE ④ is in normal operation, while the first line ⑤ between the first DSLAM ① and the first CPE ② is a newly added line. The first line ⑤ is determined as the line to be detected, the CO end scenario is determined as the most likely application scenario according to the electrical length L of the first line ⑤, and a CO power control policy is applied.

In step 6b, the rate setting of the first line ⑤ is detected, and it is judged whether the rate is constant. If the rate is constant, the process proceeds to step 6c. If the rate is not constant, the process proceeds to step 6e.

Figure 8:
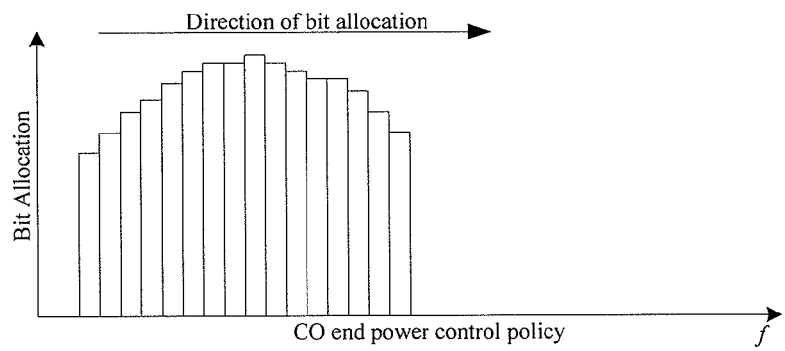
FIG. 8 is a schematic diagram illustrating a bit allocation principle of a Central Office (CO) power control policy when the data rate is fixed.

In step 6c, bit allocation of the CO end power control policy follows an allocation principle from low frequency to high frequency. FIG. 8 illustrates a particular bit allocation manner.

In step 6d, it is judged whether bits in frequency bands where $SNR(f) \leq n(f)$ have been allocated. In other words, it is judged whether reserved low frequency band resources are entirely occupied or not.

If the reserved low frequency band resources are entirely occupied, the transmitting power in this frequency band in the newly added line may be selected arbitrarily within a range specified by standards, because the line in normal operation does not transmit over this spectrum segment. In this example, the transmitting power in this frequency in the first line ⑤ may be selected arbitrarily within a range specified by standards, without any interference to the second line ⑥, because the second line ⑥ does not transmit over this spectrum segment. Then, the process proceeds to step 6f.

If the reserved low frequency band resources are not entirely occupied, the process proceeds to step 6e.

In step 6e, when SNR(f)>n(f), the processing may be performed according to various existing xDSL standards, and the signal-noise-ratio $SNR_w(f)$ of the newly added line may be calculated. The transmitting power of the newly added line, i.e. the first line ⑤, may be adjusted according to the signal-noise-ratio $SNR_w(f)$.

In addition, in the frequency band meeting the conditions of SNR(f)>n(f), the transmitting power of the second line ⑥ may be decreased properly, to reduce the crosstalk between lines (e.g. the second crosstalk ⑦ as shown in FIG. 5). In an example, the transmitting power may be processed according to the far end power control policy, i.e. the transmitting power may be calculated via step 67 as described above.

In step 6f, the system determines the adjusted line transmitting power, reduces or eliminates crosstalk between lines by using the adjusted line transmitting power, to enable the normal operation of lines.

In step 6g, the system continues to automatically detect whether the ground noise SNR(f) of the newly added line has changed. If the ground noise SNR(f) of the newly added line has changed, the process proceeds to step 6a. If the ground noise SNR(f) of the newly added line has not changed, the process proceeds to step 6f. In this way, the system may adapt to the variations of the lines dynamically, i.e., the system have an adaptive characteristic.

Figure 9:
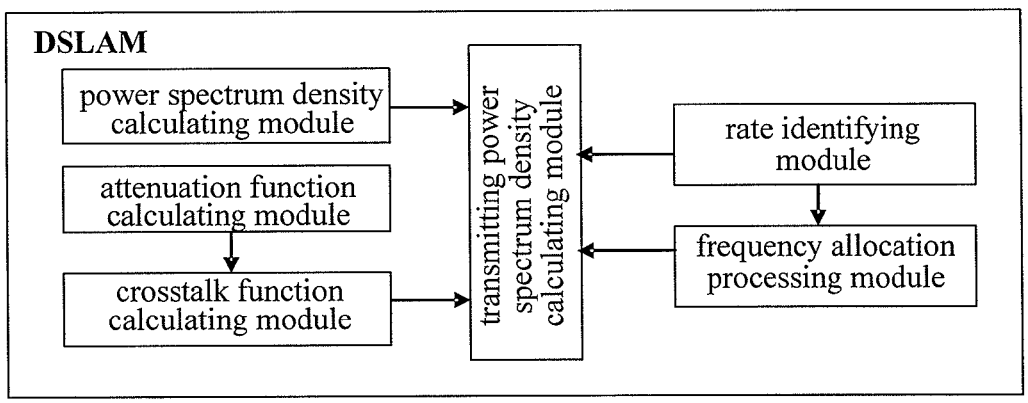
FIG. 9 is a schematic diagram illustrating the structure of an apparatus according to the invention.

FIG. 9 illustrates a structure of an apparatus for adaptive power adjustment according to the invention. As shown in FIG. 9, the apparatus includes:

a power spectrum density calculating module, adapted to calculate a power spectrum density value of a crosstalk to a line of a local device from adjacent lines. The calculation may be done as described above, and is not repeated herein;

an attenuation function calculating module, adapted to calculate an attenuation function of the line of the local device, and provide the attenuation function to a crosstalk function calculating module to be used as a basis for calculating a crosstalk function. The calculation may be done as described above, and is not repeated herein;

a crosstalk function calculating module, adapted to calculate a crosstalk function, to the line of the local device, from the adjacent lines. The calculation may be done as described above, and is not repeated herein;

a transmitting power spectrum density calculating module, adapted to calculate a transmitting power spectrum density of the local device according to the power spectrum density value of the crosstalk and values of the crosstalk function. The calculation may be done as described above, and is not repeated herein.

In the invention, the apparatus for adaptive power adjustment may further include a frequency allocation processing module. The frequency allocation processing module is adapted to determine, according to a relationship between an electrical length of a newly added line and a preset value, to employ a bit allocation principle from low frequency to high frequency (i.e. a CO end power control policy) when the electrical length is greater than the preset value, or employ a bit allocation principle from high frequency to low frequency (i.e. a far end power control policy) when the electrical length is less than or equal to the preset value, and trigger the transmitting power spectrum density calculating module when bit allocation in the frequency band is finished, to adjust and control a transmitting power.

In the invention, the apparatus for adaptive power adjustment may further include a rate identifying module. The rate identifying module is adapted to judge whether a rate is constant, trigger the frequency allocation processing module if the rate is constant, or directly trigger the transmitting power spectrum density calculating module if the rate is not constant.

In the invention, the apparatus for adaptive power adjustment may be arranged in a Digital Subscriber Line Access Multiplexer (DSLAM), to adjust power adaptively based on the reduction of the crosstalk between DSLs.

In summary, in the invention, dynamical spectrum may be managed automatically, and the adverse affect resulted from the crosstalk between the lines may be mitigated, without the control or information of the system.

While some embodiments of the present invention have been described above, the scope of the present invention is not intended to be limited to these. Any of various modifications and substitutions readily recognized by a person of ordinary skill of the art within the spirit and scope of the present invention is intended to be encompassed in the protection scope of the present invention defined by the following claims.

What is claimed is:

1. A method for adaptive power adjustment based on reduction of crosstalk between Digital Subscriber Lines (DSLs), comprising:

calculating a power spectrum density of crosstalk to a line from adjacent lines, and determining a crosstalk function;

calculating and determining a transmitting power spectrum density of a local device according to the calculated power spectrum density of the crosstalk and the crosstalk function; and controlling, by the local device, a transmitting power according to the transmitting power spectrum density, wherein the calculating and determining the transmitting power spectrum density of the local device comprises:

calculating an attenuation function of the line, and calculating a value of the crosstalk function according to the attenuation function; and calculating the value of the transmitting power spectrum density according to the value of the power spectrum density and the value of the crosstalk function, and controlling the transmitting power according to the value of the transmitting power spectrum density;

wherein the value of the power spectrum density is calculated according to a ground noise value and an additional white Gaussian noise value;

wherein the value of the power spectrum density $X_{tlk}(f)$ is:

$$X_{tlk}(f) = \begin{cases} SNR(f) & SNR(f) > n(f) \\ -\infty & SNR(f) \leq n(f) \end{cases} dB,$$

$SNR(f)$ being a ground noise; $n(f)$ being an additional white Gaussian noise.

2. The method for adaptive power adjustment based on reduction of crosstalk between Digital Subscriber Lines according to claim 1, wherein before calculating the power spectrum density of the crosstalk and determining the crosstalk function, the method further comprises:

determining an electrical length value of the line of the local device, and calculating the power spectrum density of the crosstalk to the line from the adjacent lines and determining the crosstalk function if the electrical length value is less than a preset value.

3. The method for adaptive power adjustment based on reduction of crosstalk between Digital Subscriber Lines according to claim 2, wherein the preset value is set according to transmission characteristics of the line or according to actual application environment.

4. The method for adaptive power adjustment based on reduction of crosstalk between Digital Subscriber Lines according to claim 1, wherein the attenuation function of the line is:

$LOS(L,f) = k_0 L + k_1 L\sqrt{f} + k_2 Lf$ dB, $k_0$ $k_1$ $k_2$ being constants, each having a value within a range between ±15.

5. The method for adaptive power adjustment based on reduction of crosstalk between Digital Subscriber Lines according to claim 1, wherein the crosstalk function is:

$$|H_{xtalk}(f)|^2 = 10 \times \log_{10}\left(10^{\frac{LOS(L,f)}{5}} \times m \times L \times f^2\right)$$

m being a crosstalk coupling constant having a value of $9.877 \times 10^{-21}$ the attenuation function of the line.

6. The method for adaptive power adjustment based on reduction of crosstalk between Digital Subscriber Lines according to claim 1, wherein the transmitting power spectrum density is:

$$TxPSD_3(L, f) = \begin{cases} (X_{tlk}(f) + |H_{xtalk}(f)|^2) + PSD_0(f) & SNR(f) \\ PSD(f) & SNR(f) \end{cases}$$

$PSD_0(f)$ being a function of frequency which is an arbitrary density function meeting specifications of standards, $X_{tlk}(f)$ being the density, $X_{tlk}(f)$ being the crosstalk function.

7. The method for adaptive power adjustment based on reduction of crosstalk between Digital Subscriber Lines according to claim 1, wherein before calculating the power spectrum density of the crosstalk to the line from the adjacent lines and determining the crosstalk function, the method further comprises:

determining an electrical length value of the line of the local device, employing a frequency allocation principle from low frequency to high frequency if the electrical length value of the line of the local device is greater than a preset value, or employing a frequency allocation principle from high frequency to low frequency if the electrical length value of the line of the local device is less than or equal to the preset value.

8. The method for adaptive power adjustment based on reduction of crosstalk between Digital Subscriber Lines according to claim 7, further comprising:

utilizing a standard power as the transmitting power of the local device if reserved low frequency band resources are entirely occupied; and/or calculating the power spectrum density of the crosstalk to the line from the adjacent lines and determining the crosstalk function if reserved high frequency band resources are entirely occupied.

9. The method for adaptive power adjustment based on reduction of crosstalk between Digital Subscriber Lines according to claim 7, wherein before determining the electrical length value of the line of the local device, the method further comprises:

judging whether a rate of the local device is constant, determining the electrical length value of the line of the local device if the rate is constant, or calculating the power spectrum density of the crosstalk to the line from the adjacent lines and determining the crosstalk function if the rate is not constant, and utilizing a standard power as the transmitting power of the local device when the electrical length value of the line of the local device is greater than the preset value.

10. The method for adaptive power adjustment based on reduction of crosstalk between Digital Subscriber Lines according to claim 1, further comprising:

judging whether a ground noise of the line of the local device has changed, continuing normal operation if the ground noise of the line of the local device has not changed, or calculating the power spectrum density of the crosstalk to the line from the adjacent lines and determining the crosstalk function if the ground noise of the line of the local device has changed.

11. An apparatus for adaptive power adjustment, comprising:

a power spectrum density calculating module, adapted to calculate a power spectrum density value of a crosstalk to a line of a local device from adjacent lines, wherein the power spectrum density value is calculated according to a ground noise value and an additional white Gaussian noise value;

a crosstalk function calculating module, adapted to calculate a crosstalk function, to the line of the local device, from the adjacent lines;

a transmitting power spectrum density calculating module, adapted to calculate a transmitting power spectrum density of the local device according to the power spectrum density value of the crosstalk and a value of the crosstalk function; and an attenuation function calculating module, adapted to calculate an attenuation function of the line of the local device, and provide the attenuation function to the crosstalk function calculating module to be used as a basis for calculating the crosstalk function;

wherein the value of the power spectrum density $X_{tlk}(f)$ is:

$$X_{tlk}(f) = \begin{cases} SNR(f) & SNR(f) > n(f) \\ -\infty & SNR(f) \le n(f) \end{cases} dB,$$

SNR(f) being a ground noise; n(f) being an additional white Gaussian noise.

12. The apparatus for adaptive power adjustment according to claim 11, further comprising:

a frequency allocation processing module, adapted to determine, according to a relationship between an electrical length of a newly added line and a preset value, to employ a bit allocation principle from low frequency to high frequency when the electrical length is greater than the preset value, or employ a bit allocation principle from high frequency to low frequency when the electrical length is less than or equal to the preset value, and trigger the transmitting power spectrum density calculating module when bit allocation in frequency band is finished.

13. The apparatus for adaptive power adjustment according to claim 12, further comprising:

a rate identifying module, adapted to judge whether a rate is constant, trigger the frequency allocation processing module if the rate is constant, or directly trigger the transmitting power spectrum density calculating module if the rate is not constant.

14. The apparatus for adaptive power adjustment according to claim 11, wherein the apparatus for adaptive power adjustment is arranged in a Digital Subscriber Line Access Multiplexer, DSLAM.

15. The apparatus for adaptive power adjustment according to claim 11, wherein the apparatus for adaptive power adjustment arranged in a Digital Subscriber Line Access Multiplexer, DSLAM.

16. The apparatus for adaptive power adjustment according to claim 12, wherein the apparatus for adaptive power adjustment is arranged in a Digital Subscriber Line Access Multiplexer, DSLAM.

17. The apparatus for adaptive power adjustment according to claim 13, wherein the apparatus for adaptive power adjustment is arranged in a Digital Subscriber Line Access Multiplexer, DSLAM.

* * * * *

UNITED STATES PATENT AND TRADEMARK OFFICE
CERTIFICATE OF CORRECTION

PATENT NO.      : 7,826,338 B2                                  Page 1 of 1
APPLICATION NO. : 12/051691
DATED           : November 2, 2010
INVENTOR(S)     : Zhou It is certified that error appears in the above-identified patent and that said Letters Patent is hereby corrected as shown below:

Column 10, line 63, after "9.877x10(-21)," insert the phrase -- $LOS(L_i f)$ --.

Column 11, line 3, after "$SNR(f)$," insert the phrase -- $> n(f)$ --.

Column 11, line 4, after "$SNR(f)$," insert the phrase -- $\leq n(f)$ --.

Column 11, line 9, after the words "being the," insert the words -- power spectrum --.

Signed and Sealed this
First Day of February, 2011

David J. Kappos
*Director of the United States Patent and Trademark Office*